(12) United States Patent
Ohkawa (10) Patent No.: US 7,448,783 B2
(45) Date of Patent: Nov. 11, 2008

(54) EMISSION DEVICE

(75) Inventor: Shingo Ohkawa, Misato (JP)

(73) Assignee: Enplas Corporation, Kawaguchi (JP)

( * ) Notice: Subject to any disclaimer, the term of this patent is extended or adjusted under 35 U.S.C. 154(b) by 40 days.

(21) Appl. No.: 11/641,007

(22) Filed: Dec. 19, 2006

(65) Prior Publication Data

US 2007/0268722 A1   Nov. 22, 2007

(30) Foreign Application Priority Data

Dec. 19, 2005  (JP) .............................. 2005-365319

(51) Int. Cl.
*F21V 5/00* (2006.01)
*G02B 3/00* (2006.01)

(52) U.S. Cl. .................. 362/555; 362/327; 362/338

(58) Field of Classification Search .............. 362/555, 362/558, 327, 338, 800; 257/98, 100; 359/718, 359/741, 726

See application file for complete search history.

(56) References Cited

U.S. PATENT DOCUMENTS 2,215,900 A * 9/1940 Bitner .................. 362/309
5,485,317 A * 1/1996 Perissinotto et al. ......... 359/712
6,335,548 B1   1/2002 Roberts et al.
7,347,603 B2 * 3/2008 Ikeda et al. ................ 362/555
2005/0201118 A1 * 9/2005 Godo ........................ 362/555

FOREIGN PATENT DOCUMENTS

JP        2005-5740        1/2005

* cited by examiner

*Primary Examiner*—Stephen F. Husar
*Assistant Examiner*—Peggy A. Neils
(74) *Attorney, Agent, or Firm*—Staas & Halsey LLP (57) ABSTRACT

Provided is a light emitting device having an inner-propagation-medium which caused directivity-to-optical-axis-direction to be relaxed. Light of a LED travels in the inner-propagation-medium, being emitted from an inside area of or outside area in a lens surface directly or via an inclined reflection face. A light emitter provides an output light having an intensity profile with a half-intensity-angular-range not greater than 20°, which expresses directivity of the output light. The outside area in the lens surface performs a traveling-direction-expanding-function which is not only relatively intensive as compared that performed by the inside area in the lens surface, and but also relatively intensive as compared that performed in an imaginary case where the outside area gives a planar surface perpendicular to an optical axis. The half-intensity-angular-range of the intensity profile of the light emitting device is not smaller than 30° with respect to the optical axis and not greater than 70°. The lens face may be formed of one or more convex surfaces in the outside area.

3 Claims, 11 Drawing Sheets

EMISSION DEVICE

BACKGROUND

Field of Invention

The present invention relates to an art for improving an emission device employing a point-like light source a typical example of which is a LED, in particular, to techniques for enabling output light having a angular intensity profile showing a gently descending slope around an optical axis to be provided if a "light emitter" emitting light having an intensive directivity.

It is noted that "a light emitter" is composed of "a point-like light source and a reflection means providing a reflection face surround the point-like light source from sidewise directions". The present invention can be applied, for example, to devices such as illumination devices or displays which look vivid as viewed from a rather wide angular range around a frontal direction.

A well-known emission device employs a LED as a light emitting source, being applied to devices such as illumination devices or displays. In general, although light emitted from a LED has a directivity toward an optical axis direction, some rays directed to an angular range from obliquely-forward directions to sidewise directions. It is difficult to utilize effectively in general uses such rays (called "sidewise emission") of in directions much deviated (for example, by 70° to 90°; called " ") with respect to an optical axis direction.

Figure 1:
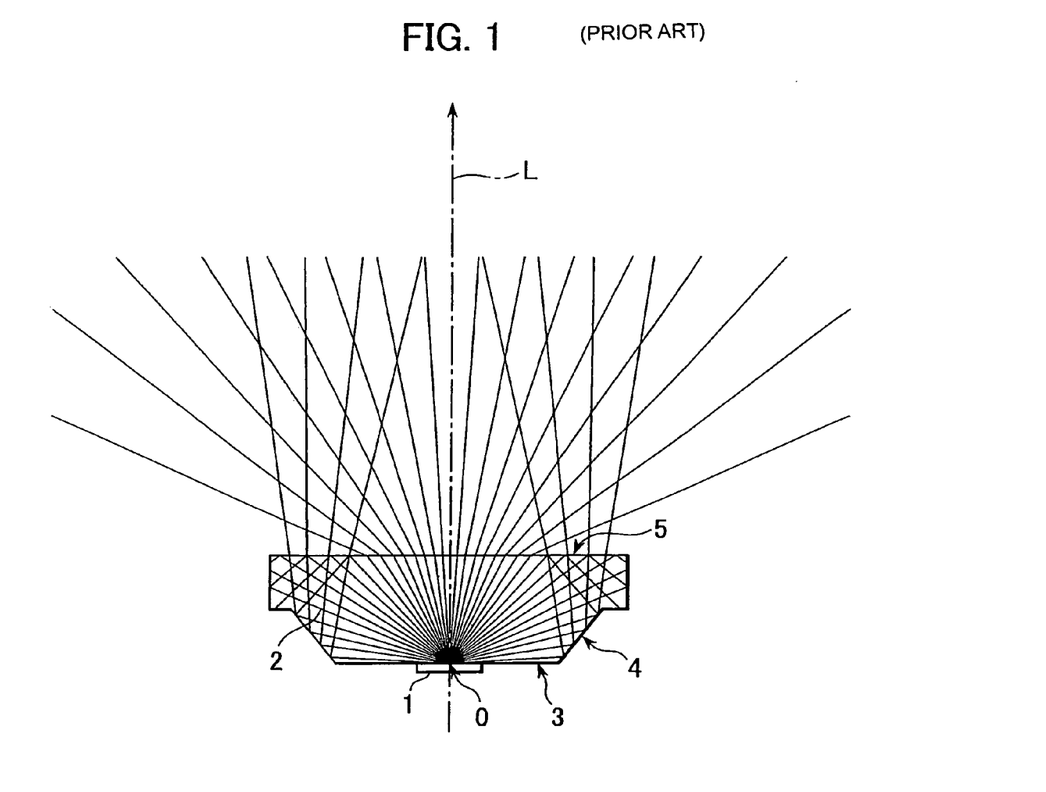
FIG. 1 is a cross section view of a known fundamental structure of an emission device (first Prior Art) wherein rays are illustrated together.

According to a proposed structure for avoiding such sidewise emission from being useless, a cup-like reflector is employed to provide a reflection face at a light outgoing side of LED. It is noted that "optical axis" is defined as a direction corresponding to a weighted intensity center of a three-dimensional intensity distribution of light fluxes emitted from a LED. FIG. 1 is a cross section showing a fundamental example (first Prior Art) of the above structure. Reference numeral 1 denotes a chip of LED-element which has light emitting center O located at a center portion of a front face (i.e. a face of light emitting side). Used hereafter is an expression such as "LED 1".

Reference numeral 2 denotes a block made of a light permeable resin (such as silicone ]resin, epoxy resin), providing an inner-propagation-medium covering which covers a solid angle range of $2\pi$ to transmit emission from LED 1. Hereafter, this is called simply "block 2".

A lower generate half part (a generate half part near to LED 1) of block 2 has a surface configuration like a cup, being provided with a bottom which is denoted by reference numeral 3 and corresponds to a mounting base face (illustrated as a horizontal face) of LED 1. Reference numeral 4 denotes an inclined reflection face (called simply "reflection face" hereafter conveniently) which rises up from an outer periphery of bottom 3 obliquely outward. This reflection face 4 reflects sidewise emission referred to above toward generally a frontal direction. Although almost all of this reflection can be made total reflection, a reflection film made of, for example, Al or Ag may be formed on a block-outer-face providing reflection face 4 for making sure. Instead, block 2 may be covered by a cup-like reflection member having a highly reflective inner face. It is noted that bottom face 3 is formed of a reflection face in many cases.

In the instant specification, a combination of such reflection means (a member providing an inclined reflection face) and LED is called "light emitter. This naming is used in a second Prior Art and embodiments described below in generally the same manner. It is noted that an inner portion (i.e. a volume portion performing inner propagation) of block 2 is, for the sake of convenience. not included in "light emitter". An optical axis of the light emitter is denoted by reference symbol L.

Block 2 has a flat face (curvature=0) opposite to LED 1 and the flat face provides emission face 5 of the emission device. Emission from emission face 5 can be generally classified into "indirect emission" travelling via reflection face 4 and "direct emission" travelling otherwise. It is noted that these terms (direct emission/indirect emission) are used in the instant specification overall because the above classification can be applied correctly to the second Prior Art and embodiments described below.

Figure 3:
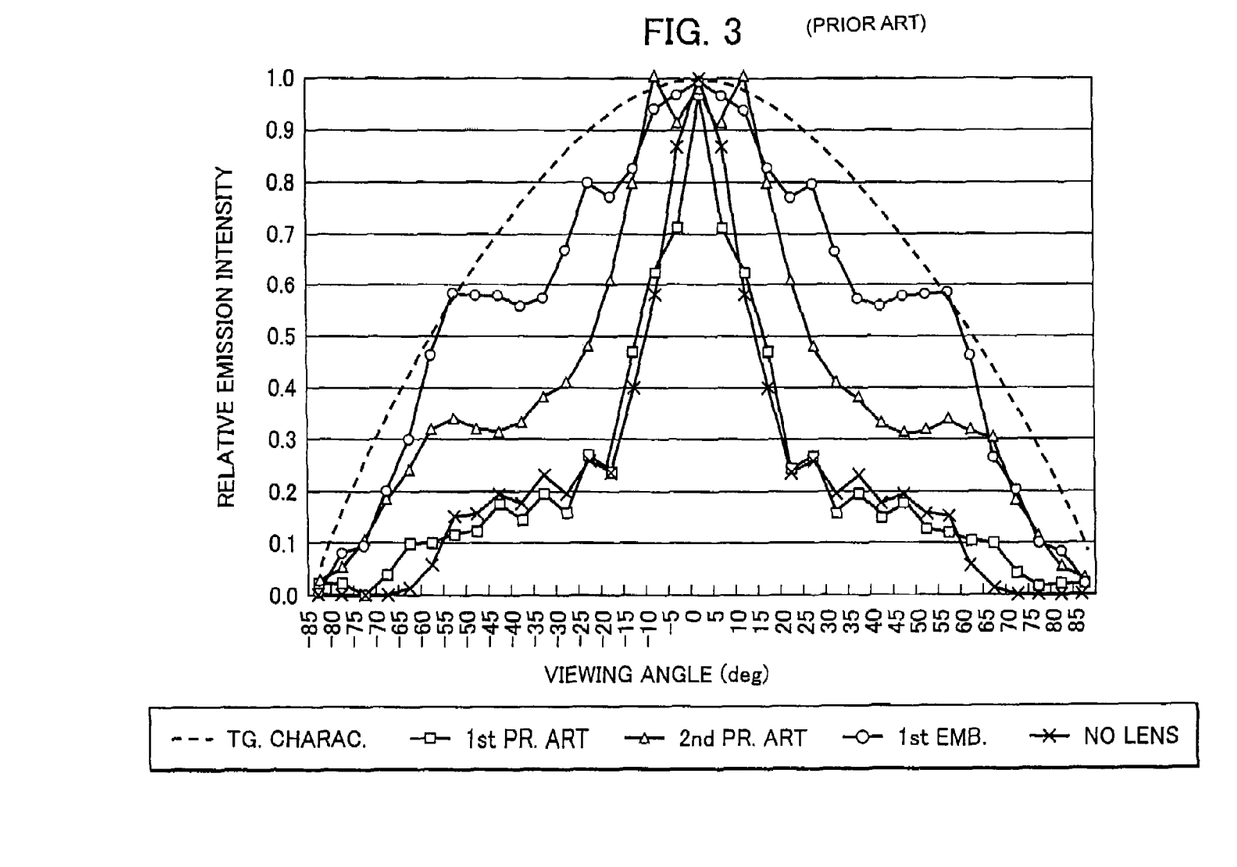
FIG. 3 is a graph showing intensity profiles (calculated theoretical values) depending on angle of first Prior Art, second Prior Art, first Embodiment and a light emitter (no lens) wherein target-characteristics are shown together.

A typical example of intensity-profile-depending-on-angle of a light emitter is shown by a curve plotted by marks X in FIG. 3.

FIG. 3 gives graph showing intensity-profiles-depending-on-angle (calculated theoretical values; simulation calculation of light intensity values depending on angle based on light path tracing and weighting according to emission-intensity-profile-depending-on-angle of LED) of the second Prior Art, a first embodiment and a light emitter (NO LENS), other than that of the first Prior Art, together with target characteristics.

It is noted that "NO LENS" shown in FIG. 3 means "block 2 is excluded", namely, "only light emitter".

Abscissa in FIG. 3 gives angle of light outputting direction, giving a direction of optical axis L (i.e. a direction giving the maximum intensity) at 0° and expressing inclination directions for both sides thereof in a range from 0° to ±85°. In FIG. 3, the intensity profiles on a plane passing optical axis L are illustrated under a condition such that emission output of light emitter is isotropic around the optical axis overall (i.e. in a range covering 360°), respectively. If emission output of light emitter is anisotropic around the optical axis overall (i.e. in a range covering 360°), they express "omnidirectional averages". These matters related to the graphs shown in FIG. 3 are applicable to graphs shown in FIG. 9 in generally the same way.

As understood from the graph plotted by marks X in FIG. 3, a half-intensity-angular-range (marks X), which expresses directivity of emission of light emitter, extends from a direction of optical axis L to about 15°. In other words, remarkably intensive directivity is expressed. In many usages, such directivity toward optical axis direction is too intensive. This directivity toward optical axis direction is modified somewhat by using block 2. However, it is no more than a result as shown by a curve (the first Prior Art) plotted by marks □ in FIG. 3.

As illustrated by rays in FIG. 1, direct emission proceeds radially in block 2 after leaving LED 1, being emitted from emission face 5. Refraction occurs thereby according to Snell' law. Indeed this refraction has a function of expanding travelling directions of direct emission, but the function is very weak except for directions largely deviated from the direction of optical axis L.

On the other hand, indirect emission proceeds in block 2 toward reflection face 4 after leaving LED 1, being reflected by reflection face 4 and inner-incident to emission face 5 at angles near to the right angle (i.e. at small inner-incidence angles). Although refraction occurs thereby according to Snell' law, a function of expanding travelling directions is weak too, because the inner-incidence angles are small. Therefore, remarkable function of expanding travelling directions are performed for neither direct emission nor indirect emission, after all, resulting in the plotting of marks □, as guessed.

Figure 2:
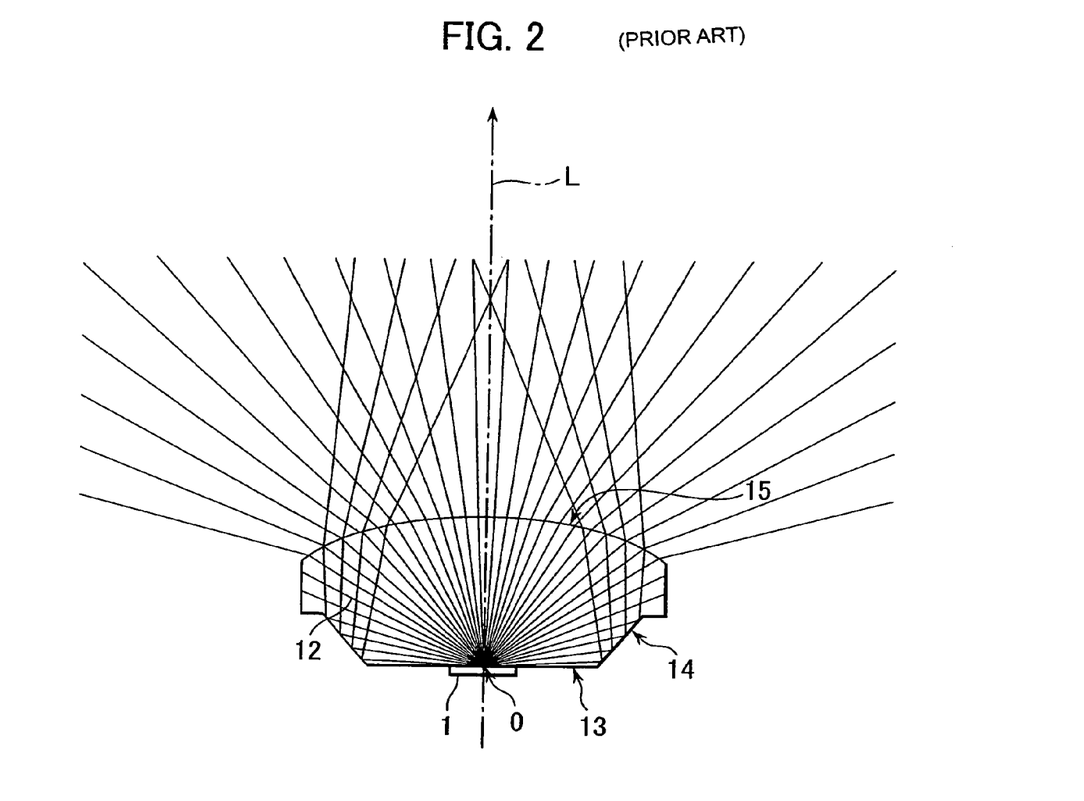
FIG. 2 is a cross section view of another known structure of an emission device (second Prior Art) wherein rays are illustrated together.

FIG. 2 is a cross section view of a second Prior Art employing another block different from the first Prior Art as innerpropagation-medium. Structure is the same as that of first Prior Art except that block 2 is replaced by block 12. Difference between block 2 and block 12 is provided by emission face configuration and other parts are not changed.

A lower generally half part (a generally half part near to LED 1) of block 12 has a surface configuration like a cup.

Reference numeral 13 denotes a bottom face corresponding to a mounting base face (illustrated as a horizontal face) of LED 1, and reference numeral 14 denotes an inclined reflection face (called simply "reflection face" hereafter conveniently) which rises up from an outer periphery of bottom 13 obliquely outward. This reflection face 14 reflects sidewise emission toward generally a frontal direction.

Although almost all of this reflection can be made total reflection, a reflection film made of, for example, Al or Ag may be formed on a block-outer-face providing reflection face 14 for making sure. Instead, block 12 may be covered by a cup-like reflection member having a highly reflective inner face. It is noted that bottom face 13 is formed of a reflection face in many cases.

An optical axis of the light emitter is denoted by reference symbol L. Block 12 has a gently curved face opposite to LED 1 to provide emission face 15.

As illustrated by rays in FIG. 2, direct emission proceeds radially in block 2 after leaving LED 1, being emitted from emission face (convex face) 15. Refraction occurs thereby according to Snell' law. This involves a function of expanding travelling directions of direct emission, although the function is weaker than that of the first Prior Art because emission face 15 is a gently curved convex face.

However, if curvature of convex face (emission face) 15 is large to a degree such that parallel rays (proceeding in parallel with optical axis L inversely) incident to convex face 15 from the outside (upside in the illustration) of block 12 has a focus point according with light emitting center O within the inner-propagation-medium, almost no function of expanding travelling directions is performed and a function of collimator (light flux parallelizing means) is performed.

Needless to say, if curvature of convex face 15 exceeds that is enough to form a collimator, a function of expanding travelling directions is obtained, but such a large curvature is not given to convex face 15.

To convex faces formed in outside areas in second to forth embodiments described later are applied the above idea, namely, a method of giving a more intensive function of expanding travelling directions as compared with a case where a flat face is provided to a convex face by forming the convex face as to have a large curvature exceeding that enough to form a collimator.

On the other hand, indirect emission proceeds in block 12 toward reflection face 14 after leaving LED 1, being reflected by reflection face 14 and inner-incident to emission face 15 at angles near to the right angle (i.e. at small inner-incidence angles). Although refraction occurs thereby according to Snell' law, a function of expanding travelling directions is weak too, because the inner-incidence angles are small.

However, since vicinage of a periphery edge of the convex face curved gently is inclined somewhat, a slightly improved function of expanding travelling directions as compared with the first Prior Art might be obtained.

After all, the second Prior Art also fails to be expected that a rapid intensity falling around optical axis L is strikingly relaxed. As a result, an intensity profile as shown by a curve plotted by marks Δ in FIG. 3 is obtained.

As described above, if an inner-propagation-medium (block) has an emission face configured gently convex (i.e. curvature radius is larger than distance from a LED to the emission face), directivity toward an optical axis direction is relaxed, but more sufficient relaxation is demanded in some cases.

A dotted curve shown in FIG. 3 gives an ideal intensity profile (target characteristics) satisfying such demand. The curve shows characteristics according to which relative intensity value gives no sharp reduction in the vicinity of a direction of optical axis, involving gradual falling until angles giving half-intensity (i.e. plus and minus angles at which relative intensity is 0.5 with respect to a peak intensity of 1; in the same way hereafter). As a result, a remarkably large half-intensity-angular-range (half-value-angles with respect to the optical axis direction (direction of 0°)) is obtained.

In the case of the illustrated ideal intensity profile (target characteristics), a half-intensity-angular-range of about 65° is obtained. By the way, according to intensity profile of the first Prior Art, a half-intensity-angular-range of about 15° is provided, which is far from being ideal. According to intensity profile of the second Prior Art, a half-intensity-angular-range of about 25° is provided, which is unsatisfactory in spite of being improved to some degree.

It is noted that, if emission face 15 in the second Prior Art has a curvature such that emission from LED 1 makes a focus point located in the vicinity of emission face 15 after being emitted from emission face 15, the above relaxation can be enforced after passing the focus point, but inclination of emission face 15 becomes excessively large and inner-reflection amount of light produced by reflection face 14 increases, with the result that amount of emission after undergoing complex path history and problems of disorder (local rising or falling) in intensity profile (local rising or falling) or the like rise.

Thus it is clarified by experience or simulation calculation that good results are not obtained by the second Prior Art if curvaTURE OF emission face 15 is large.

In addition, as described later, the present invention employs a method according to which an emission face of inner-propagation-medium is divided into an inside area and an outside area which are configured differently and the following Document 1 (See FIG. 9) discloses a case which seems to be an example of application of the method.

However, this fails to show achievement of relaxation of directivity toward an optical axis direction. FIG. 9b shows a Fresnel lens face, teaching merely how to modify configuration to reduce the whole thickness with curvature of the whole lens kept constant, in view of optical definition of Fresnel lens, and essential difference between the second Prior Art and FIG. 9b is not shown.

Document 1; Tokkai-2005-5740

OBJECT AND SUMMARY OF INVENTION

An object of the present invention is to provide an emission device of a type which comprises a light emitter composed of a point-like light source and a reflection means providing a reflection face arranged on a light outgoing side of said point-like light source as to surround said point-like light source sideways, and an inner-propagation-medium in which output light of said light emitter inner-propagates, which is capable of emitting light from an emission face of inner-propagation-medium with an efficiently relaxed directivity if said light emitter outputs light having a strong directivity toward an optical axis direction.

The present invention is applied to an emission device comprising a light emitter composed of a point-like light source and a reflection means providing a reflection face arranged on a light outgoing side of said point-like light source as to surround said point-like light source sideways, and an inner-propagation-medium in which output light of said light emitter inner-propagates, wherein a first intensity profile expressing directivity of output light of said light emitter has a half-intensity-angular-range which is not greater than 20° with respect to an optical axis direction giving the maximum intensity, and said inner-propagation-medium has an emission face for emitting said output light after inner propagation.

According to a feature of the present invention, said emission face has an inside area extending around a position at which said emission face crosses said optical axis and an outside area extending as to surround said inside area, said reflection face being inclined as to reflect light, which is emitted from said point-like light source and reaches said reflection face via inner-propagation-medium, mainly toward said outside area.

In addition, said inside area provides a lens surface which has a first traveling-direction-expanding-function for expanding traveling directions of light which is emitted from said point-like light source and reaches said inside area via inner-propagation-medium without impinging on said reflection face, and said outside area provides another lens surface which has a second traveling-direction-expanding-function for expanding traveling directions of light which is emitted from said point-like light source and reaches said outside area after being reflected by said reflection face via inner-propagation-medium.

Further, said second traveling-direction-expanding-function is stronger than a traveling-direction-expanding-function which is effected in an imaginary case where said outside area is formed of a flat face perpendicular to said optical axis, and said first traveling-direction-expanding-function is weaker than said second traveling-direction-expanding-function.

Still further, a second intensity profile expressing directivity of a total output light composed of light emitted from said inside area and light emitted from said outside area has a half-intensity-angular-range which is not smaller than 30° and not greater than 70° with respect to said optical axis direction.

inner propagation light said outside area may provide at least one concave-like lens surface, and may provide at least one convex-like lens surface.

According to the present invention, an emission device, which comprises a light emitter composed of a point-like light source and a reflection means providing a reflection face arranged on a light outgoing side of said point-like light source as to surround said point-like light source sideways, and an inner-propagation-medium in which output light of said light emitter inner-propagates, can be capable of emitting light from an emission face of inner-propagation-medium with an efficiently relaxed directivity if said light emitter outputs light having a strong directivity toward an optical axis direction.

EMBODIMENTS

Figure 4:
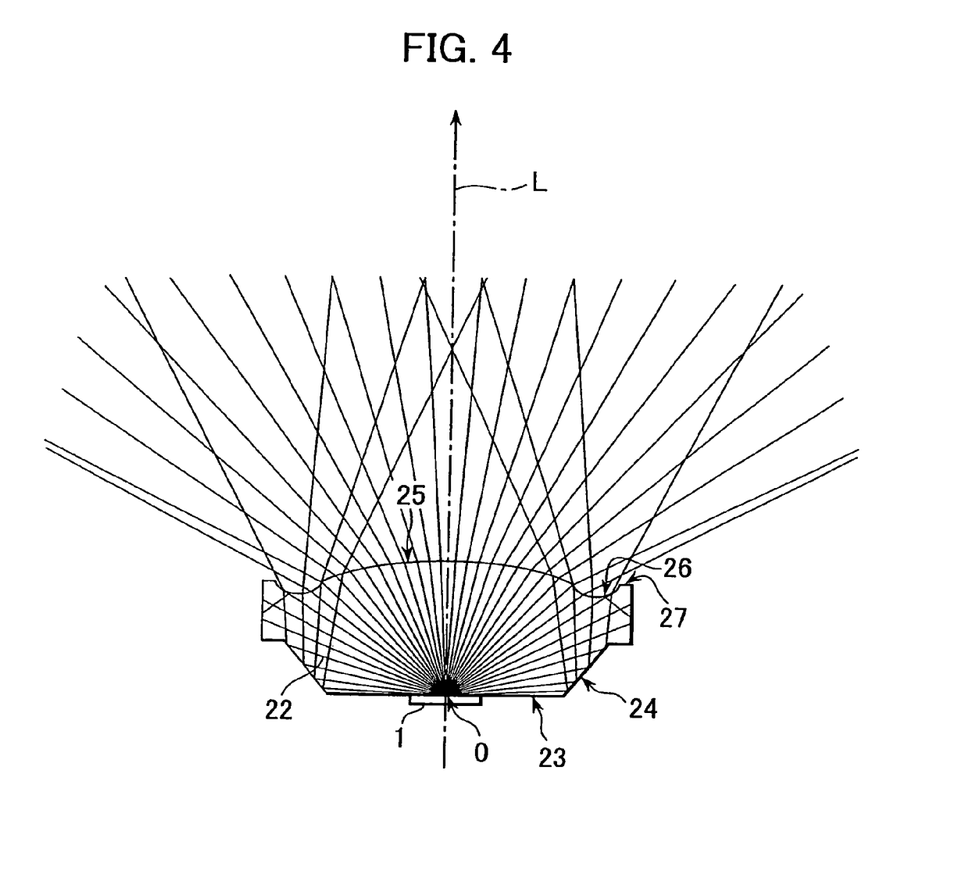
FIG. 4 is a cross section view of a structure of an emission device of first Embodiment wherein rays are illustrated together.

FIG. 4 is a cross section view of a structure of an emission device of first Embodiment wherein rays are illustrated together. Structure is the same as those of the first and second Prior Arts except that block 2 or 12 is replaced by block 22. Difference between block 22 and blocks 2, 12 is provided by emission face configuration and other parts are not changed.

In other words, a lower generally half part (a generally half part near to LED 1) of block 22 has a surface configuration like a cup.

Reference numeral 23 denotes a bottom face corresponding to a mounting base face (illustrated as a horizontal face) of LED 1, and reference numeral 24 denotes an inclined reflection face (called simply "reflection face" hereafter conveniently) which rises up from an outer periphery of bottom 23 obliquely outward.

This reflection face 24 reflects sidewise emission toward generally a frontal direction. Although almost all of this reflection can be made total reflection, a reflection film made of, for example, Al or Ag is preferably formed on a block-outer-face providing reflection face 24 and bottom face 23 for making sure. Block 22 may be covered by a cup-like reflection member having a highly reflective inner face to provide reflection face 24 surely.

Figure 5:
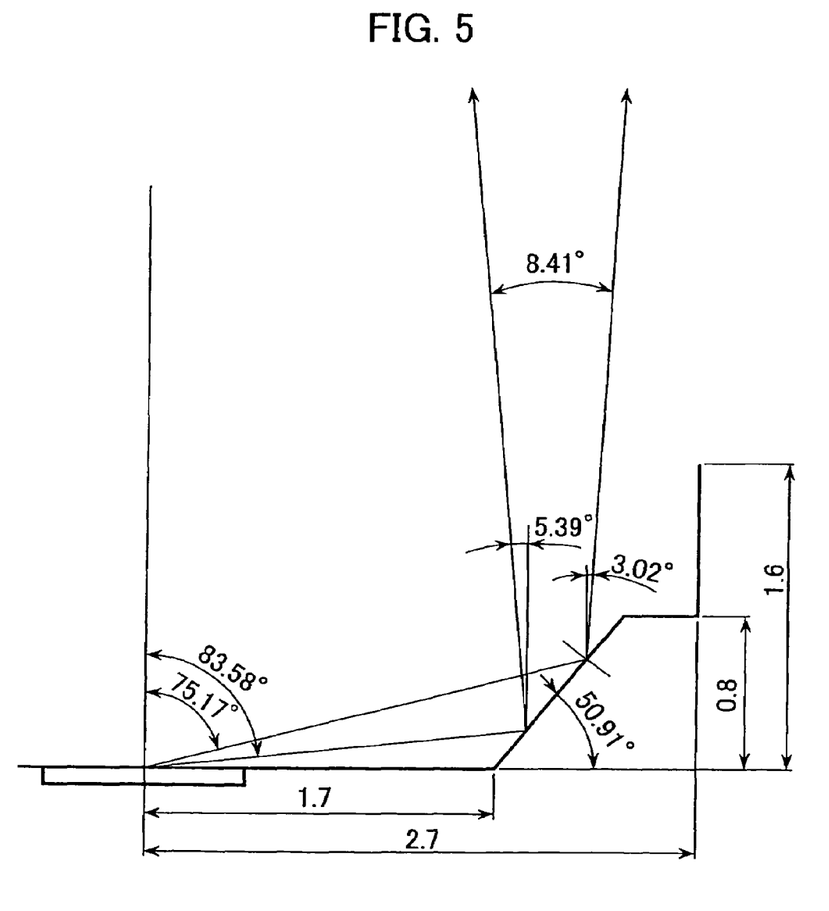
FIG. 5 is a diagrammatic view of an example of configuration and dimension regarding a light emitter composed of a LED and a reflection means providing an inclined reflection face.

FIG. 5 is a diagrammatic view of an example of configuration and dimension regarding a light emitter composed of a LED and a reflection means providing an inclined reflection face (reflection face 24 in this embodiment). In FIG. 5, unit of numerals expressing length is mm. As shown therein, inclination angle of an inclined reflection face 50.91° with respect to a mounting base face (illustrated as a horizontal face). In addition, distance from a light emitting center to an initially rising point (an outer edge of a bottom face) is 1.7 mm, and height to the upmost portion of the inclined reflection face is 0.8 mm. There is a extruding portion extruding by 1 mm outward, which has an outer periphery forming a wall vertical to the mounting base face. Height of the wall is 0.8 mm.

For the sake of understanding function of the inclined reflection face, exemplarily shown is path of a light flux outputted in an angular range from 75.17° to 83.58° (diverging angle of 8.41°) with respect to a direction of optical axis together. As illustrated therein, direction of the light flux is converted into a direction generally parallel with the optical axis, with diverging angle of 8.41° being kept, by being reflected at the inclined reflection face.

It is noted that these matters described regarding FIG. 5 correspond to conditions which are employed in calculation of intensity profiles shown in FIG. 3 for not only this embodiment but also the first and second Prior Arts already described. In addition, conditions under which intensity profiles shown in FIG. 9 for the second to the forth embodiments are calculated are the same as the above.

Returning to FIG. 4, reference symbol L denotes an optical axis of the light emitter. This optical axis L accords with an optical axis of LED 1 L too, except for an error caused by factors such as manufacturing error (for example, about 1° or less). In addition, there is substantial accordance with an optical axis of an emission device according to each embodiment.

An emission face of block 22 is provided by a face opposite to LED 1 has an inside area and an outside area configurations of which are determined respectively. In this embodiment, the inside area is formed of a gently curved convex face 25 and outside area is formed of a suitably curved concave face 26.

Concave face 26 may have a configuration that is provided by rotating an arc-like cross section shape as illustrated by 360° around optical axis L. It is noted that reference numeral 27 denotes an edge portion which is formed in order to avoid the outermost periphery part from providing a sharp blade-like part, having an upper face (providing a thin ring-like band) which is flat. Optical function of this portion is negligibly small.

As illustrated by rays in FIG. 4, direct emission proceeds radially in block 22 after leaving LED 1, and almost all direct emission is emitted from convex face 25 or concave face 26.

It is noted that emission from concave face 26 is remarkably inclined with respect to optical axis L and toward a rather broad angular range, with the result that influence on intensity profile around optical axis L is small. On the other hand, emission from convex face 25 contains much light around optical axis L, being effected by a function expanding travelling directions on being emitted to a degree that is the same as function expanding travelling directions in the case of the second Prior Art, resulting in contributing somewhat to relaxation of intensity falling around direction of optical axis L.

Next, indirect emission proceeds in block 22 toward reflection face 24 after leaving LED 1, being reflected by reflection face 24. Considering a location relation among reflection face 24, convex face 25 of the inside area and concave face 26 of the outside area together with light path shown in FIG. 5, a large part (for example 80% or more) of indirect emission reflected by reflection face 24 is inner-incident to concave face 26. Directions on inner-incidence are generally parallel with optical axis L.

Intensive effect of expanding travelling directions is applied to this indirect emission on being emitted from concave face 26. Due to the effect, an intensive directivity toward an optical axis direction of the light emitter is relaxed strikingly. As a result, an intensity profile, for example, like a curve plotted by marks ○ in FIG. 3.

This intensity profile was obtained under a condition that refractive index of block 22 is 1.51 (silicone resin), and conditions related to the light emitter are shown in FIG. 5. Concave face 26 has curvature R=5.1184 mm.

According to the present invention, a main function of an outside area is to perform expanding of travelling directions in a remarkably broad range extending from direction of optical axis in order to relax directivity toward an optical axis direction of indirect emission, and, if concave face 26 is employed as this embodiment, function of expanding travelling directions can be controlled in a wide range depending on power of refraction of concave face 26. Needles to say, in addition, it is easy to give a more intensive function of expanding travelling directions to concave face 26 as compared with that of a flat face.

As described above, it is possible to get remarkably near to an ideal intensity profile (target characteristics) shown by dotted line in FIG. 3 by giving configuration to two sections of the emission face of inner-propagation-medium (block) 22 individually and relaxing directivity toward an optical axis direction with the use of concave face 26 formed outside.

Figure 6:
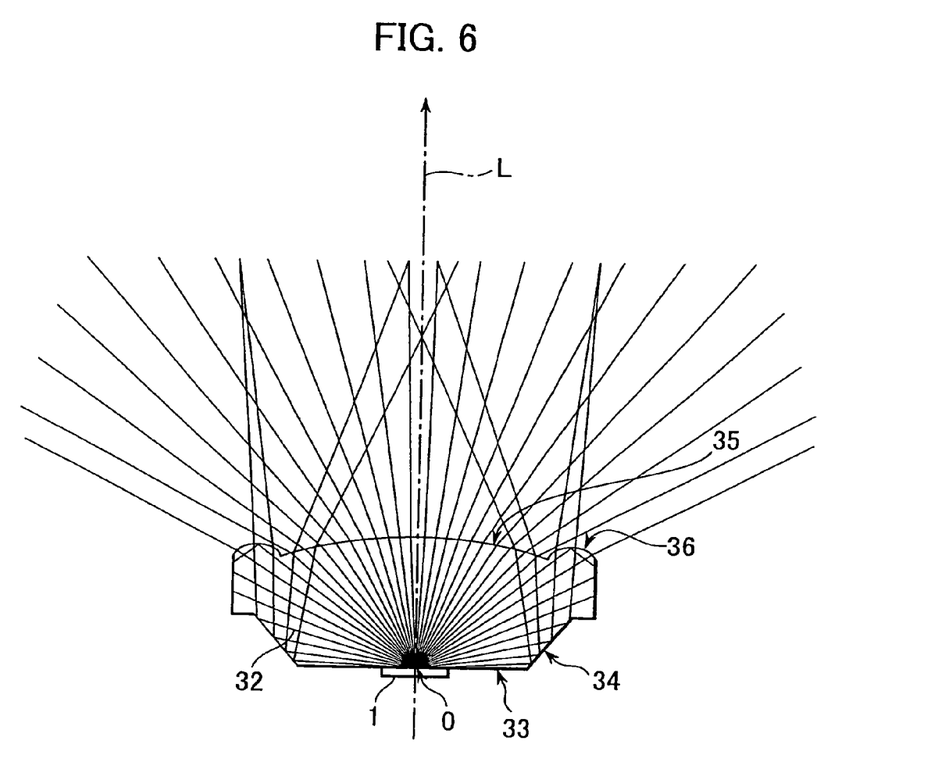
FIG. 6 is a cross section view of a structure of an emission device of second Embodiment wherein rays are illustrated together.

Next, FIG. 6 is a cross section view of a structure of an emission device of second Embodiment wherein rays are illustrated together. Structure is the same as that of first Embodiment except that block 22 is replaced by block 32. Difference between block 22 and blocks 32 is provided by emission face configuration and other parts are not changed.

In other words, a lower generally half part (a generally half part near to LED 1) of block 32 has a surface configuration like a cup.

Reference numeral 33 denotes a bottom face corresponding to a mounting base face (illustrated as a horizontal face) of LED 1, and reference numeral 34 denotes an inclined reflection face (called simply "reflection face" hereafter conveniently) which rises up from an outer periphery of bottom 33 obliquely outward.

This reflection face 34 reflects sidewise emission toward generally a frontal direction. Although almost all of this reflection can be made total reflection, a reflection film made of, for example, Al or Ag is preferably formed on a block-outer-face providing reflection face 34 and bottom face 33 for making sure. Block 32 may be covered by a cup-like reflection member having a highly reflective inner face to provide reflection face 34 surely.

Configuration and dimension regarding a light emitter composed of a LED 1 and an inclined reflection face (reflection face 34 in this embodiment) are the same as those shown in FIG. 5.

Reference symbol L denotes an optical axis of the light emitter. This optical axis L accords with an optical axis of LED 1 L too, except for an error caused by factors such as manufacturing error (for example, about 1° or less). In addition, there is substantial accordance with an optical axis of the emission device.

An emission face of block 32 is provided by a face opposite to LED 1 has an inside area and an outside area configurations of which are determined respectively. In this embodiment, the inside area is formed of a gently curved convex face 35. Convex face 35 may have configuration the same as that of convex face 25.

The outside area is formed of a convex face 36 curved at a "sufficient curvature". Concave face 36 may have a configuration that is provided by rotating an arc-like cross section shape as illustrated by 360° around optical axis L. It is noted that "sufficient curvature" is defined as "curvature giving at least more intensive function of expanding travelling directions as compared with an imaginary case where a flat face is formed".

Here, curvature of convex face 36 is expressed by γ, and the following is a simple summary of function of expanding travelling directions depending on γ changing from 0 to infinity.

(1) Case of Curvature γ=0;

This means a flat face. As described previously, a weak function of expanding travelling directions is performed, but it is not enough to obtain target characteristics (See dotted-line in FIGS. 3 and 9), being not employed in the present invention.

(2) Case of 0<Curvature γ<Curvature Functioning as a Collimator for Indirect Emission;

In this case, the greater curvature γ becomes, the weaker function of expanding travelling directions becomes. Therefore, this is not suitable for obtaining target characteristics (See dotted-line in FIGS. 3 and 9). Needless to say, this is not employed in the present invention.

(3) Case of Curvature γ=Curvature Functioning as a Collimator for Indirect Emission;

Needless to say, this is not employed in the present invention because function of expanding travelling directions is substantially lost. It is noted that this situation is realized when light path length of light emitting center→reflection face 34→convex face 36 is generally equal to a distance correspond to focal length of convex face (lens face) 36.

(4) Case of Curvature Functioning as a Collimator for Indirect Emission<Curvature γ<Infinity In this range, the greater curvature γ becomes, the stronger function of expanding travelling directions becomes and exceeds function of expanding travelling directions obtained in the case of γ=0. The present invention employs curvature at least satisfying this condition (function of expanding travelling directions is more intensive than that of a flat face).

It is needless to say that such convex face 36 has function of expanding travelling directions stronger than that of a lens face (convex face 35) of the inside area (Curvature of convex face 35 falls preferably within the above (2), having a weaker function of expanding travelling directions as compared that of a flat face).

As illustrated by rays in FIG. 6, direct emission proceeds radially in block 22 after leaving LED 1, and almost all direct emission is emitted from convex face 35 or convex face 36.

It is noted that emission from convex face 36 is remarkably inclined with respect to optical axis L and toward a rather broad angular range, with the result that influence on intensity profile around optical axis L is small. On the other hand, emission from convex face 35 contains much light around optical axis L, being effected by a function expanding travelling directions on being emitted to a degree that is the same as function expanding travelling directions in the case of the second Prior Art, resulting in contributing somewhat to relaxation of intensity falling around direction of optical axis L.

Next, indirect emission proceeds in block 32 toward reflection face 34 after leaving LED 1, being reflected by reflection face 34. Considering a location relation among reflection face 34, convex face 35 of the inside area and convex face 36 of the outside area together with light path shown in FIG. 5, at least some of indirect emission reflected by reflection face 34 is inner-incident to convex face 36.

However, it is preferable that a remarkable part (for example, 50%) of indirect emission is inner-incident to convex face 36 in order to cause convex face 36 to perform function of expanding travelling directions enough. Directions of this incidence are generally parallel with optical axis L.

As described above, convex face 36 performing at least more intensive function of expanding travelling directions as compared with an imaginary case where a flat face is formed brings refraction toward many directions, resulting in sufficient expansion of travelling directions. This effect relaxes strikingly an intensive directivity toward an optical axis direction of the light emitter. As a result, an intensity profile like a curve plotted by marks ◇ in FIG. 3 is obtained.

This intensity profile was obtained under a condition that refractive index of block 32 is 1.51 (silicone resin), and conditions related to the light emitter are shown in FIG. 5. Convex face 35 has curvature R=5.2444 mm.

According to the present invention, a main function of an outside area is to perform expanding of travelling directions in a remarkably broad range extending from direction of optical axis in order to relax directivity toward an optical axis direction of indirect emission, and, if convex face 36 is employed as this embodiment and curvature is selected as to meet the above condition (stronger function of expanding travelling directions as that of a flat face), function of expanding travelling directions can be controlled in a wide range depending on power of refraction.

Figure 9:
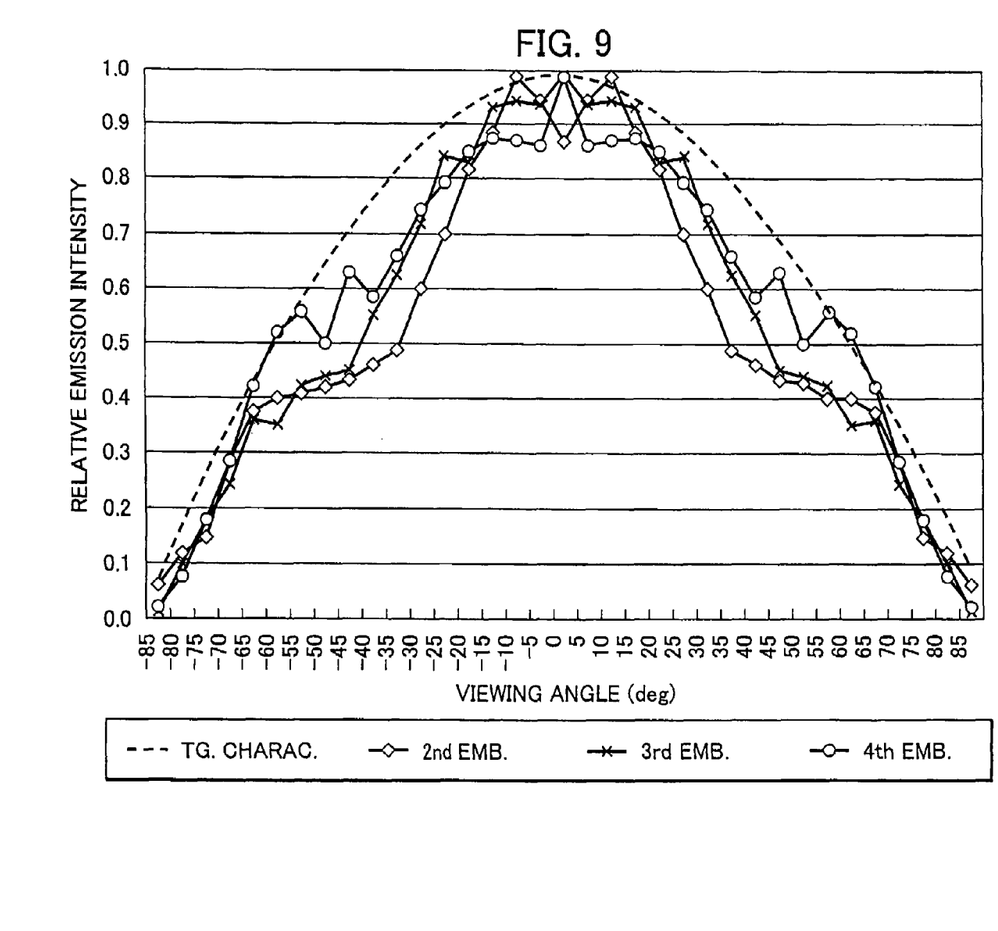
FIG. 9 is a graph showing intensity profiles (calculated theoretical values) depending on angle of second Embodiment through Forth Embodiment wherein target-characteristics are shown together.

As described above, it is possible to get remarkably near to an ideal intensity profile shown by dotted line in FIG. 9 (the same as target characteristics shown in FIG. 3) by giving configuration to two sections of the emission face of inner-propagation-medium (block) 32 individually and relaxing directivity toward an optical axis direction with the use of convex face 36 formed outside.

Figure 7:
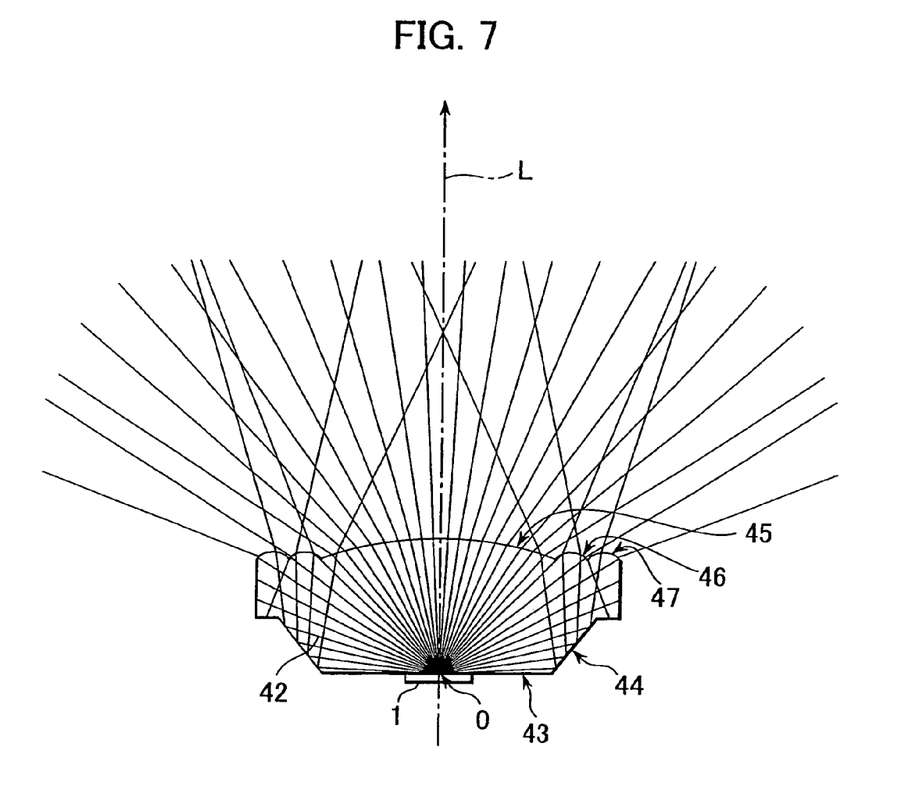
FIG. 7 is a cross section view of a structure of an emission device of Third Embodiment wherein rays are illustrated together.

Next, FIG. 7 is a cross section view of a structure of an emission device of third Embodiment wherein rays are illustrated together. Structure is the same as that of second Embodiment except that block 32 is replaced by block 42. Difference between block 32 and blocks 42 is provided by emission face configuration and other parts are not changed.

In other words, a lower generally half part (a generally half part near to LED 1) of block 42 has a surface configuration like a cup.

Reference numeral 43 denotes a bottom face corresponding to a mounting base face (illustrated as a horizontal face) of LED 1, and reference numeral 44 denotes an inclined reflection face (called simply "reflection face" hereafter conveniently) which rises up from an outer periphery of bottom 43 obliquely outward.

This reflection face 44 reflects sidewise emission toward generally a frontal direction. Although almost all of this reflection can be made total reflection, a reflection film made of, for example, Al or Ag is preferably formed on a block-outer-face providing reflection face 44 and bottom face 43 for making sure. Block 42 may be covered by a cup-like reflection member having a highly reflective inner face to provide reflection face 44 surely.

Configuration and dimension regarding a light emitter composed of a LED 1 and an inclined reflection face (reflection face 44 in this embodiment) are the same as those shown in FIG. 5.

Reference symbol L denotes an optical axis of the light emitter. This optical axis L accords with an optical axis of LED 1 L too, except for an error caused by factors such as manufacturing error (for example, about 1° or less). In addition, there is substantial accordance with an optical axis of the emission device.

An emission face of block 42 is provided by a face opposite to LED 1 has an inside area and an outside area configurations of which are determined respectively. In this embodiment, the inside area is formed of a gently curved convex face 45. Convex face 45 may have configuration the same as that of convex face 35.

The outside area is formed of convex faces 46 and 47 each of which is curved at a sufficient curvature. Each of convex faces 46 and 47 may have a configuration that is provided by rotating an arc-like cross section shape as illustrated by 360° around optical axis L. It is noted that "sufficient curvature" is the same as that described for convex face 36 in second Embodiment.

That is, each of convex faces 46, 47 has a curvature such that "stronger function of expanding travelling directions than that of a case where a flat face is formed imaginarily is performed".

As described already, such convex faces 46, 47 have functions of expanding travelling directions stronger than that of a lens face (convex face 45) of the inside area (Curvature of convex face 45 falls preferably within the above (2), having a weaker function of expanding travelling directions as compared that of a flat face).

As illustrated by rays in FIG. 7, direct emission proceeds radially in block 42 after leaving LED 1, and almost all direct emission is emitted from convex face 45, convex face 46 or 47.

It is noted that emission from convex face 46 or 47 is remarkably inclined with respect to optical axis L and toward a rather broad angular range, with the result that influence on intensity profile around optical axis L is small.

On the other hand, emission from convex face 45 contains much light around optical axis L, being effected by a function expanding travelling directions on being emitted to a degree that is the same as function expanding travelling directions in the case of the second Prior Art, resulting in contributing somewhat to relaxation of intensity falling around direction of optical axis L.

Next, indirect emission proceeds in block 42 toward reflection face 44 after leaving LED 1, being reflected by reflection face 44. Considering a location relation among reflection face 44, convex face 45 of the inside area and convex faces 46, 47 of the outside area together with light path shown in FIG. 5, a large part (for example 80% or more) of indirect emission reflected by reflection face 44 is inner-incident to convex face 46 or 47. Incidence directions thereof are generally parallel with optical axis L.

As described above, convex face 46 and 47 performing at least more intensive function of expanding travelling directions as compared with an imaginary case where a flat face is formed brings refraction toward many directions, resulting in sufficient expansion of travelling directions. This effect relaxes strikingly an intensive directivity toward an optical axis direction of the light emitter. As a result, an intensity profile like a curve plotted by marks X in FIG. 3 is obtained.

This intensity profile was obtained under a condition that refractive index of block 42 is 1.51 (silicone resin), and conditions related to the light emitter are shown in FIG. 5. Each of convex faces 46 and 47 has curvature R=0.283 mm and convex face 45 has curvature R=5.0446 mm.

According to the present invention, if two convex faces 46, 47 are formed and curvature is selected as to meet the above condition (stronger function of expanding travelling directions as that of a flat face), function of expanding travelling directions can be controlled in a wide range depending on power of refraction and it made possible to get remarkably near to an ideal intensity profile shown by dotted line in FIG. 9 (the same as target characteristics shown in FIG. 3).

Figure 8:
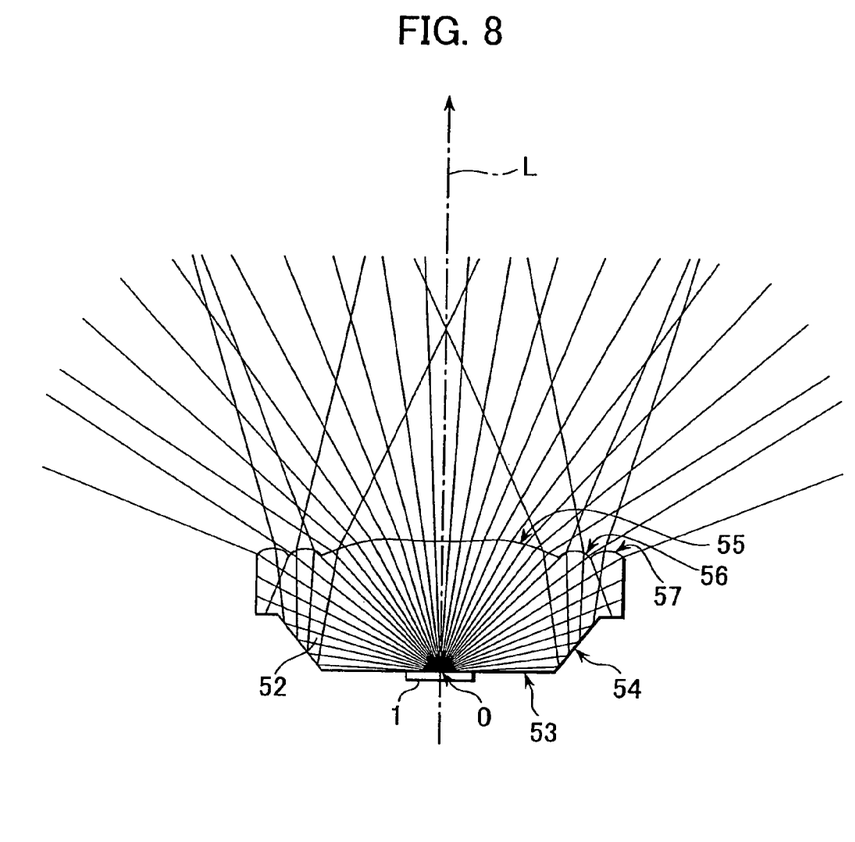
FIG. 8 is a cross section view of a structure of an emission device of Forth Embodiment wherein rays are illustrated together.

FIG. 8 is a cross section view of a structure of an emission device of forth Embodiment wherein rays are illustrated together. Structure is the same as that of third Embodiment except that block 42 is replaced by block 52. Difference between block 42 and blocks 52 is provided by emission face configuration and other parts are not changed.

In other words, a lower generally half part (a generally half part near to LED 1) of block 52 has a surface configuration like a cup.

Reference numeral 53 denotes a bottom face corresponding to a mounting base face (illustrated as a horizontal face) of LED 1, and reference numeral 54 denotes an inclined reflection face (called simply "reflection face" hereafter conveniently) which rises up from an outer periphery of bottom 53 obliquely outward. As for variations of formation of reflection face 54, repeated description is omitted because generally the same ways are employed. Further, in generally the same way as compared with third Embodiment, optical axis L of the light emitter accords substantially with those of LED 1 and the emission device.

An emission face of block 52 is provided by a face opposite to LED 1 has an inside area and an outside area configurations of which are determined individually. In this embodiment, the inside area is formed of a gently curved aspheric face 55.

As illustrated, undulations of aspheric face 55 are gentle. Aspheric face 55 provides two convex surfaces along a radial direction. Further, any fine undulation such as fine, the third, convex surface may be formed between the two convex surfaces.

Anyway, aspheric face 55 is formed of undulations which are provided by deforming a flat face very gently along the radial direction, having a very weak function of expanding travelling directions, which cannot be stronger that of the outside area (convex faces 56, 57).

The outside area is formed of convex faces 56, 57 which have the same configurations as compared with convex faces 46, 47 in third Embodiment, respectively. In other words, each of convex faces 56, 57 may have a configuration that is provided by rotating an arc-like cross section shape as illustrated by 360° around optical axis L. Further, curvature such that stronger function of expanding travelling directions than that of a case where a flat face is formed imaginarily is performed is given.

As described above, such convex faces 56, 57 have functions of expanding travelling directions stronger than that of a lens face (aspheric face 55) of the inside area (aspheric face 55 is designed preferably so that function of expanding travelling directions enough to assist function of expanding travelling directions of convex faces 56 and 57 in the outside area is performed and incident angles of a main part of direct emission to a lens face (aspheric face 55) in the inside area are preferably not greater than critical angle, and curvature is small and function of expanding travelling directions is weak).

As illustrated by rays in FIG. 8, direct emission proceeds radially in block 52 after leaving LED 1, and almost all direct emission is emitted from aspheric face 55, convex face 56 or 57.

It is noted that emission from convex face 56 or 57 is remarkably inclined with respect to optical axis L and toward a rather broad angular range, with the result that influence on intensity profile around optical axis L is small.

On the other hand, emission from aspheric face 55 contains much light around optical axis L, being effected by a function expanding travelling directions on being emitted to a degree that is the same as function expanding travelling directions in the case of the second Prior Art, resulting in contributing somewhat to relaxation of intensity falling around direction of optical axis L.

Next, indirect emission proceeds in block 52 toward reflection face 44 after leaving LED 1, being reflected by reflection face 54. Considering a location relation among reflection face 44, aspheric face 55 of the inside area and convex faces 56, 57 of the outside area together with light path shown in FIG. 5, a large part (for example 80% or more) of indirect emission reflected by reflection face 54 is inner-incident to convex face 56 or 57. Incidence directions thereof are generally parallel with optical axis L.

As described above, convex face 56 and 57 performing at least more intensive function of expanding travelling directions as compared with an imaginary case where a flat face is formed brings refraction toward many directions, resulting in sufficient expansion of travelling directions. This effect relaxes strikingly an intensive directivity toward an optical axis direction of the light emitter. As a result, an intensity profile like a curve plotted by marks ○ in FIG. 3 is obtained.

This intensity profile was obtained under a condition that refractive index of block 52 is 1.51 (silicone resin), and conditions related to the light emitter are shown in FIG. 5. Each of convex faces 56 and 57 has curvature R=0.3842 mm. Aspheric face 55 has undulations as illustrated and curvature is not written because the undulations is difficult to be expressed by curvature.

According to the present invention, if two convex faces 56, 57 are formed in the outside area and aspheric face 55 is formed in the inside area, function of expanding travelling directions can be controlled like that in third Embodiment, and it made possible to get remarkably near to an ideal intensity profile shown by dotted line in FIG. 9 (the same as target characteristics shown in FIG. 3).

Four embodiments described above do not does not limit the present invention. For example, an emission face of a block providing inner-propagation-medium is allowed to have any of various configurations. Examples are shown in FIGS. 10, 11A and 11B.

Figure 10A:
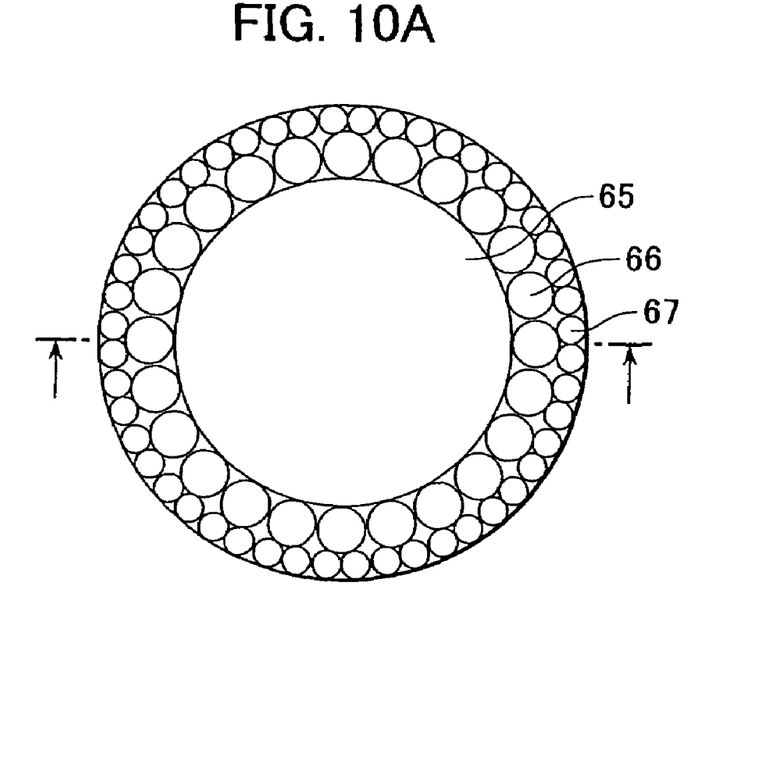
FIG. 10A is a frontal plan view of first Modification of configuration of emission face and FIG. 10B is a cross section view of the same; and, FIG. 11A is a cross section view of second Modification of configuration of emission face
Figure 10B:
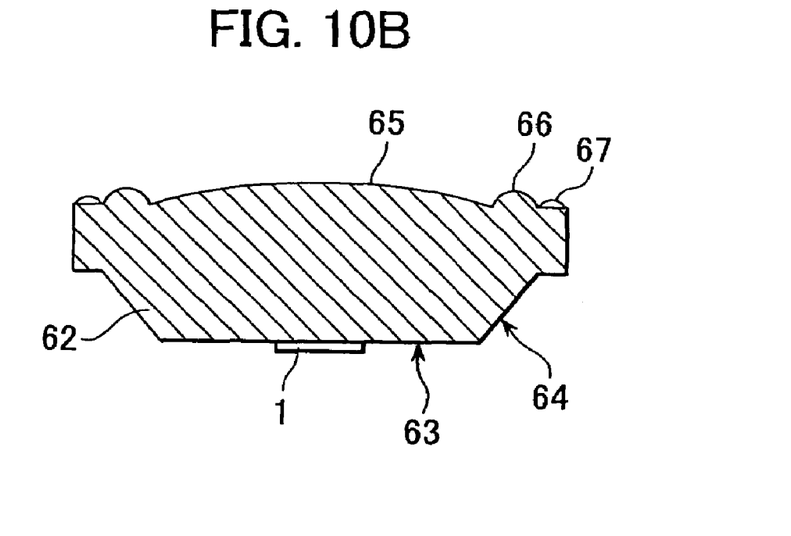
Figure 11A:
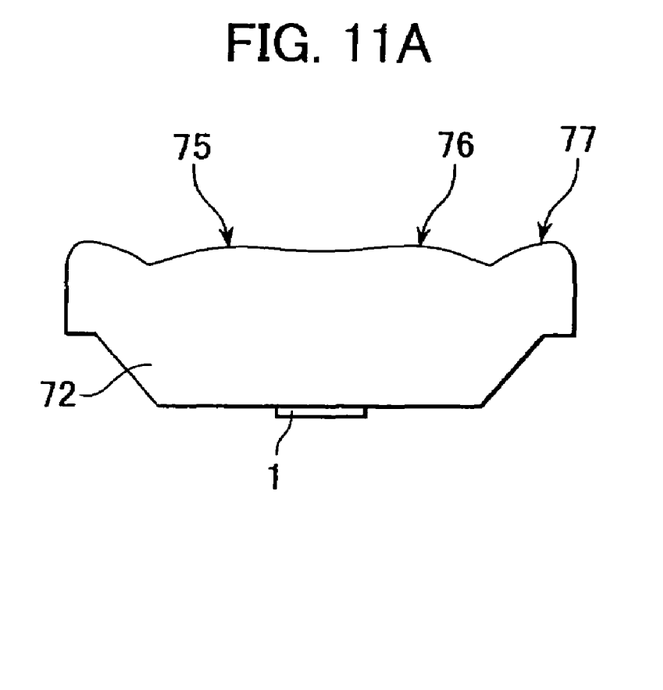
Figure 11B:
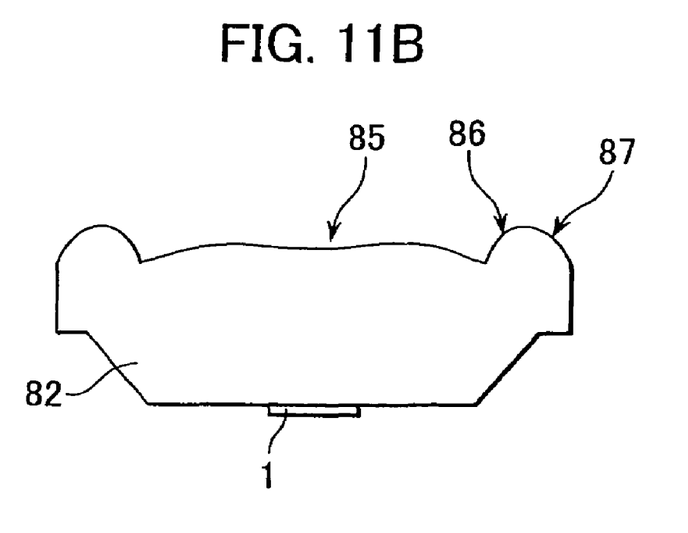
FIG. 11B is a cross section view of Third Modification of configuration of emission face.

First, a first modification of emission face configuration is illustrated in FIGS. 10A, 10B by showing a frontal plan view and a cross section view thereof, respectively.

As illustrated therein, according to this modification, a lens face of an outside area is formed of many dome-like convex faces 66, 67. Curvature of each of dome-like convex faces 66, 67 as convex lenses is large enough according to foresaid conditions, and the outside area performs a stronger function of expanding travelling directions as compared with an imaginary case where a flat face is formed.

Lens face 65 of an inside area may be any of foresaid lens faces 25, 35, 45 and 55, having a weaker function of expanding travelling directions as compared with that of the outside area. Such structure also make it possible to get remarkably near to an ideal intensity profile shown by dotted line in FIG. 9 (the same as target characteristics shown in FIG. 3).

Second and third modifications of emission face configuration are illustrated in FIGS. 11A, 11B by showing cross section views, respectively. As illustrated therein, according to these modifications, lens faces of outside areas are different from those in the embodiments described already.

According to the second modification, along a radial direction, an inside is formed of rather gentle convex face and a top portion (ring-like ridge) is formed of a sharply curved slope. Changing of curvature is selected so that the outside area, as a whole, has a stronger function of expanding travelling directions as compared with an imaginary case where a flat face is formed (Various curvature changings are prepared and then a suitable changing is picked up).

Lens face 75 of an inside area may be any of foresaid lens faces 25, 35, 45 and 55, having a weaker function of expanding travelling directions as compared with that of the outside area.

According to the third modification, along a radial direction, a sharp top portion (ring-like ridge) is formed at a center position and curved slopes 86, 87 are formed symmetrically with respect to the top portion. Changing of curvature is selected so that the outside area, as a whole, has a stronger function of expanding travelling directions as compared with an imaginary case where a flat face is formed (Various curvature changings are prepared and then a suitable changing is picked up).

Lens face 85 of an inside area may be any of foresaid lens faces 25, 35, 45 and 55, having a weaker function of expanding travelling directions as compared with that of the outside area.

It is noted that ALTHOUGH every block 2, 12, 22, 32, 42, 52, 62, 72, 82 is made of silicone resin this does not limit the present invention. Instead of silicone resin, materials having thermal plasticity such as epoxy resin, or acrylic resin, polycarbonate may be employed, materials selection may be done under consideration of property such as heat-resisting property, easiness of forming.

What is claimed is:

1. An emission device comprising:
a light emitter composed of a point-like light source and a reflection means providing a reflection face arranged on a light outgoing side of said point-like light source as to surround said point-like light source sideways; and
an inner-propagation-medium in which output light of said light emitter inner-propagates,
wherein a first intensity profile expressing directivity of output light of said light emitter has a half-intensity-angular-range which is not greater than 20° with respect to an optical axis direction giving the maximum intensity, and said inner-propagation-medium has an emission face for emitting said output light after inner propagation, said emission face having an inside area extending around a position at which said emission face crosses said optical axis and an outside area extending as to surround said inside area;
said reflection face being inclined as to reflect light, which is emitted from said point-like light source and reaches said reflection face via inner-propagation-medium, mainly toward said outside area;
said inside area providing a lens surface which has a first traveling-direction-expanding-function for expanding traveling directions of light which is emitted from said point-like light source and reaches said inside area via inner-propagation-medium without impinging on said reflection face;
said outside area providing another lens surface which has a second traveling-direction-expanding-function for expanding traveling directions of light which is emitted from said point-like light source and reaches said outside area after being reflected by said reflection face via inner-propagation-medium;
said second traveling-direction-expanding-function is stronger than a traveling-direction-expanding-function which is effected in an imaginary case where said outside area is formed of a flat face perpendicular to said optical axis;
said first traveling-direction-expanding-function is weaker than said second traveling-direction-expanding-function; and,
a second intensity profile expressing directivity of a total output light composed of light emitted from said inside area and light emitted from said outside area has a half-intensity-angular-range which is not smaller than 30° and not greater than 70° with respect to said optical axis direction.

2. An emission device according to claim 1, wherein said outside area provides at least one concave-like lens surface.

3. An emission device according to claim 1, wherein said outside area provides at least one convex-like lens surface.

* * * * *

UNITED STATES PATENT AND TRADEMARK OFFICE
CERTIFICATE OF CORRECTION

PATENT NO. : 7,448,783 B2  
APPLICATION NO. : 11/641007  
DATED : November 11, 2008  
INVENTOR(S) : Shingo Ohkawa Page 1 of 1

It is certified that error appears in the above-identified patent and that said Letters Patent is hereby corrected as shown below:

Title Page, Column 1 item [75] (Inventor), Line 1, after "Misato" insert --Saitama--.

Column 1, Line 46, change "A lower generate" to --A lower generale--.

Column 1, Line 46, change "a generate" to --a generale--.

Column 5, Line 40, change "inner" to --Inner--.

Column 13, Line 20, after "do not" delete "does not".

Signed and Sealed this

Twenty-first Day of April, 2009

JOHN DOLL  
*Acting Director of the United States Patent and Trademark Office*